(12) United States Patent
Suvkhanov et al.

(10) Patent No.: US 7,129,516 B2
(45) Date of Patent: Oct. 31, 2006

(54) ION RECOIL IMPLANTATION AND ENHANCED CARRIER MOBILITY IN CMOS DEVICE

(75) Inventors: Agajan Suvkhanov, Portland, OR (US); Mohammad R. Mirabedini, Redwood City, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 11/098,290

(22) Filed: Apr. 4, 2005

(65) Prior Publication Data

US 2005/0167654 A1    Aug. 4, 2005

Related U.S. Application Data

(62) Division of application No. 10/418,375, filed on Apr. 18, 2003, now Pat. No. 6,982,229.

(51) Int. Cl.
*H01L 29/06* (2006.01)
*H01L 31/0328* (2006.01)

(52) U.S. Cl. .................. 257/19; 257/369; 257/E29.193
(58) Field of Classification Search .................. 257/19
See application file for complete search history.

(56) References Cited

U.S. PATENT DOCUMENTS

| | | | |
|---|---|---|---|
| 4,452,644 A * | 6/1984 | Bruel et al. ................. 438/536 |
| 4,737,234 A | 4/1988 | Ruddy | |
| 5,013,578 A | 5/1991 | Brown et al. | |
| 5,266,510 A | 11/1993 | Lee | |
| 5,266,813 A | 11/1993 | Comfort et al. | |
| 5,330,929 A | 7/1994 | Pfiester et al. | |
| 5,440,152 A | 8/1995 | Yamazaki | |
| 5,567,973 A | 10/1996 | Paolella et al. | |
| 5,744,817 A | 4/1998 | Shannon | |
| 5,804,506 A | 9/1998 | Haller et al. | |
| 5,906,951 A | 5/1999 | Chu et al. | |
| 5,960,322 A | 9/1999 | Xiang et al. | |
| 6,004,137 A | 12/1999 | Crabbe et al. | |
| 6,198,135 B1 * | 3/2001 | Sonoda ........................ 257/355 |
| 6,207,978 B1 | 3/2001 | Fastow | |
| 6,319,799 B1 | 11/2001 | Ouyang et al. | |
| 6,437,375 B1 | 8/2002 | Beaman | |
| 6,498,359 B1 | 12/2002 | Schmidt et al. | |
| 6,501,135 B1 | 12/2002 | Krivokapic | |

(Continued)

OTHER PUBLICATIONS

Nobuyuki Sugii, Digh Hisamoto, Katsuyoshi Washio, Natsuki Yokoyama, and Shin'chiro Kimura, "Enhanced Performance of Strained-Si MOSFETs on CMP SiGe Virtual Substrate," IEEE, 2001, 0-7803-7052-X/01, p. 1-4.

(Continued)

*Primary Examiner*—Tu-Tu Ho
(74) *Attorney, Agent, or Firm*—L. Jon Lindsay

(57) ABSTRACT

An integrated circuit (IC) includes a CMOS device formed above a semiconductor substrate having ions therein that are implanted in the semiconductor substrate by an ion recoil procedure. The IC preferably, but not necessarily, incorporates sub-0.1 micron technology in the CMOS device. The implanted ions may preferably be germanium ions. A strained-silicon layer is preferably, but not necessarily, formed above the ion-implanted layer of the semiconductor substrate. The strained-silicon layer may be formed by a silicon epitaxial growth on the ion-implanted layer or by causing the ions to recoil into the semiconductor substrate with such energy that a region of the semiconductor substrate in the vicinity of the surface thereof is left substantially free of the ions, thereby forming a strained-silicon layer in the substantially ion-free region.

4 Claims, 4 Drawing Sheets

U.S. PATENT DOCUMENTS

| | | |
|---|---|---|
| 6,503,833 B1 | 1/2003 | Ajmera et al. |
| 6,555,839 B1 | 4/2003 | Fitzgerald |
| 6,576,532 B1 | 6/2003 | Jones et al. |
| 6,583,015 B1 * | 6/2003 | Fitzgerald et al. .......... 438/287 |
| 6,593,641 B1 | 7/2003 | Fitzergald |
| 6,709,935 B1 | 3/2004 | Yu |
| 2003/0132433 A1 | 7/2003 | Piner et al. |

OTHER PUBLICATIONS

Paul Comita, AnnaLena Thilderkvist, and Arkadii V. Samoilov, "Applied Materials FEOL Seminar 2002," Oct. 29, 2002, p. 1-37.

K. Rim, S. Koester, M. Hargrove, J. Chu, P.M. Mooney, J. Ott, T. Kanarsky, P. Ronsheim, M. Ieong, A. Grill, and H.S.P. Wong, "Strained Si NMOSFETs for High Performance CMOS Technology," IEEE 2001 Symposium on VLSI Techology Digest of Technical Papers, 2001, p. 59 (1-2).

Yee-Chia Yeo, Qiang Lu, Chenming Hu, Tsu-Jae King, T. Kawashima, M. Oishi, S. Mashiro, and J. Sakai, "Enhanced performance in sub-100 nm CMOSFETs using strained exitaxial silicon-germanium", IEEE International Electron Device Meeting Technical Digest, pp. 753-756, San Francisco, CA, Dec. 2000.

* cited by examiner

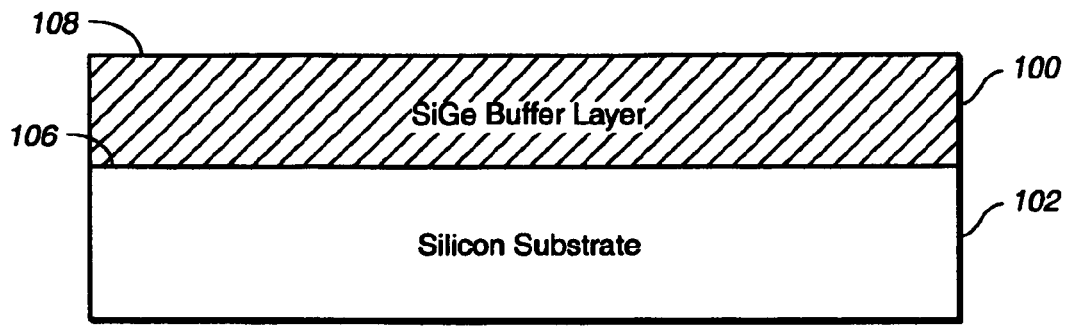
FIG._1
*(PRIOR ART)*
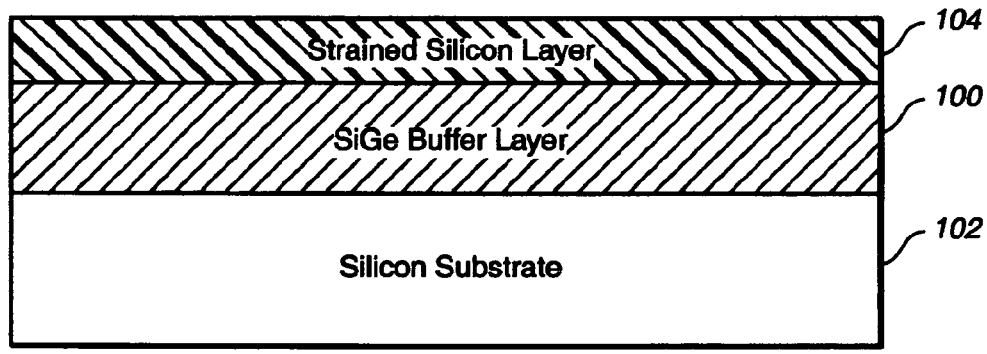
FIG._2
*(PRIOR ART)*
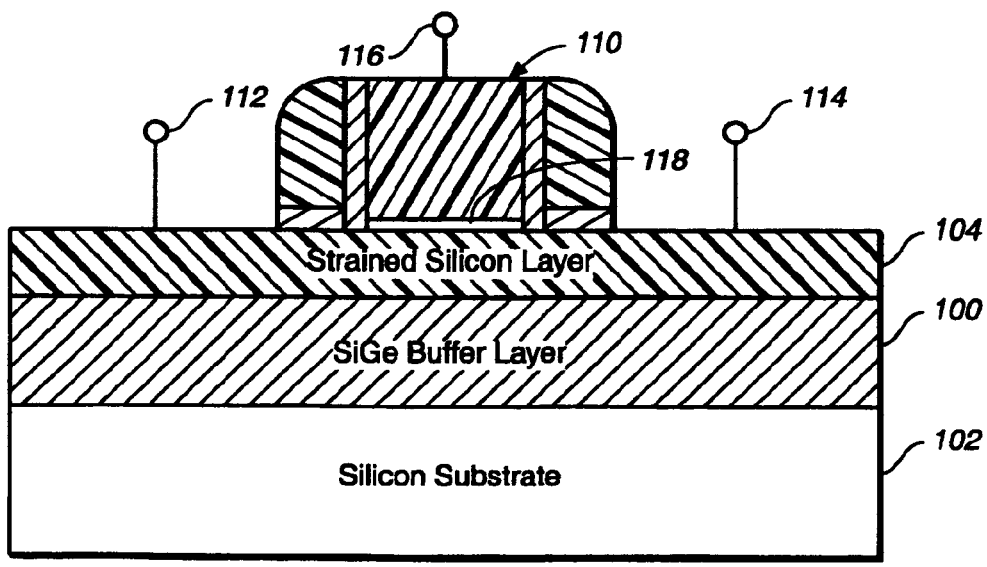
FIG._3
*(PRIOR ART)*

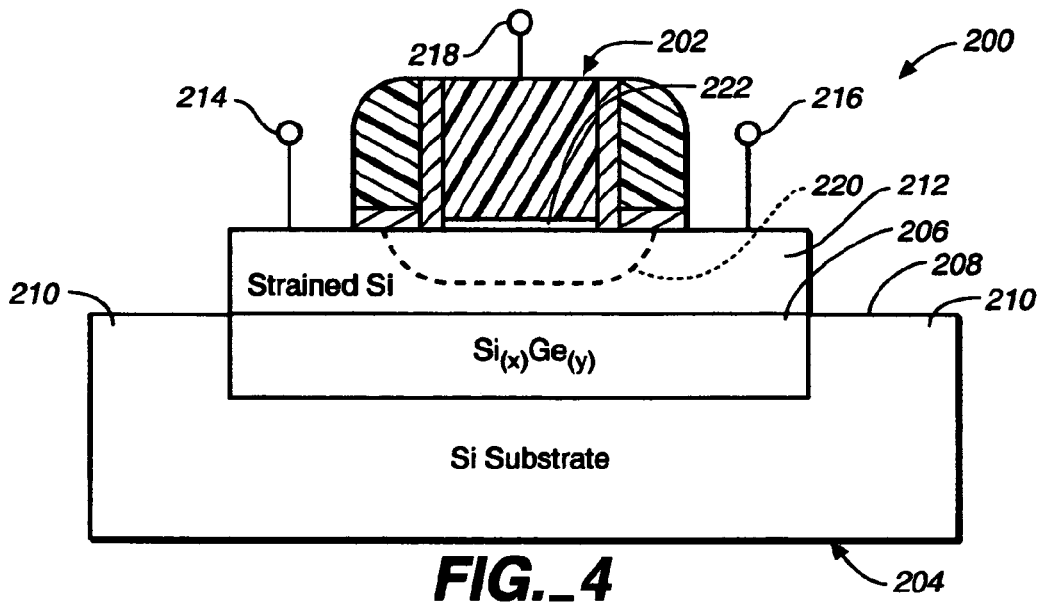
FIG._4
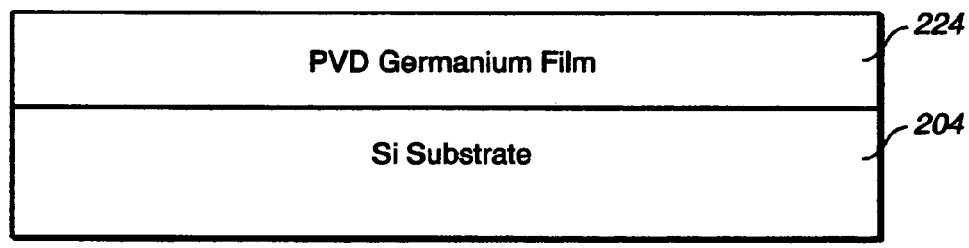
FIG._5
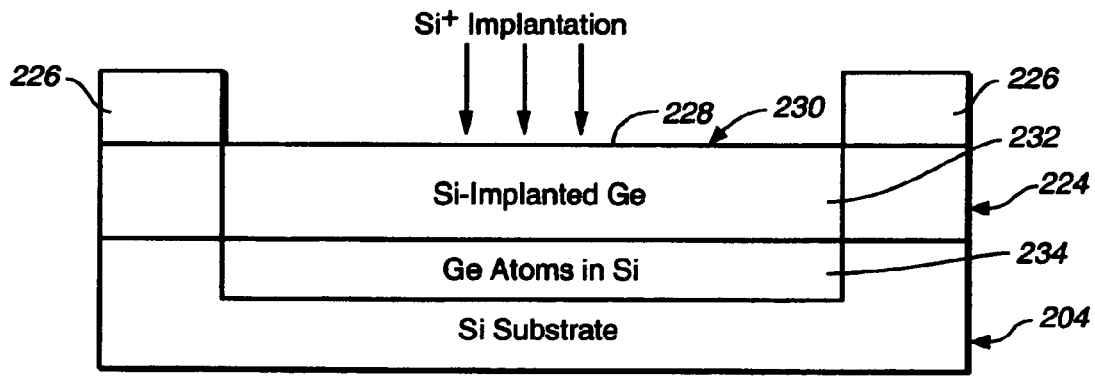
FIG._6

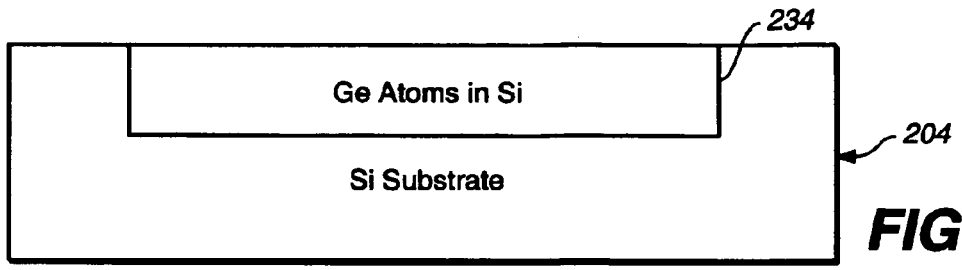
FIG._7
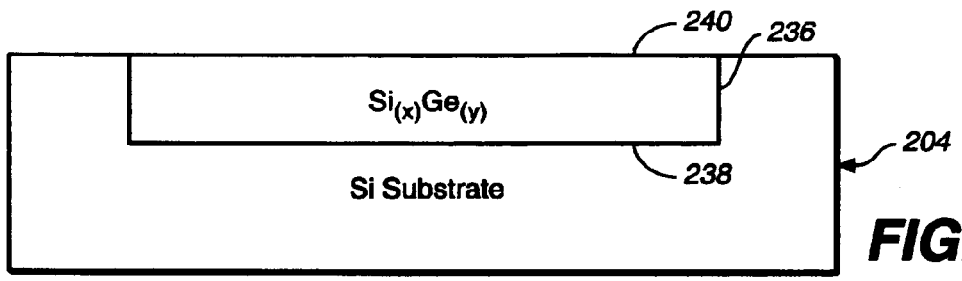
FIG._8
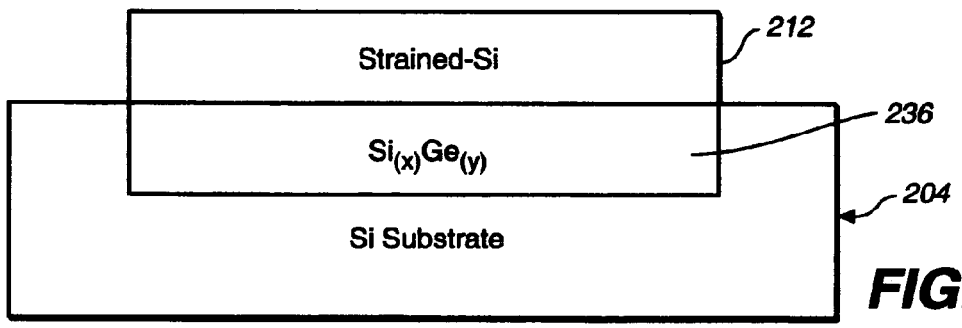
FIG._9
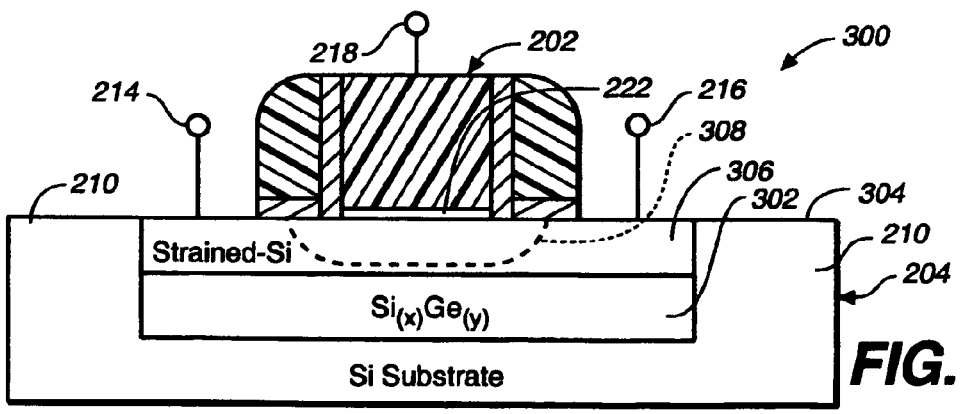
FIG._10

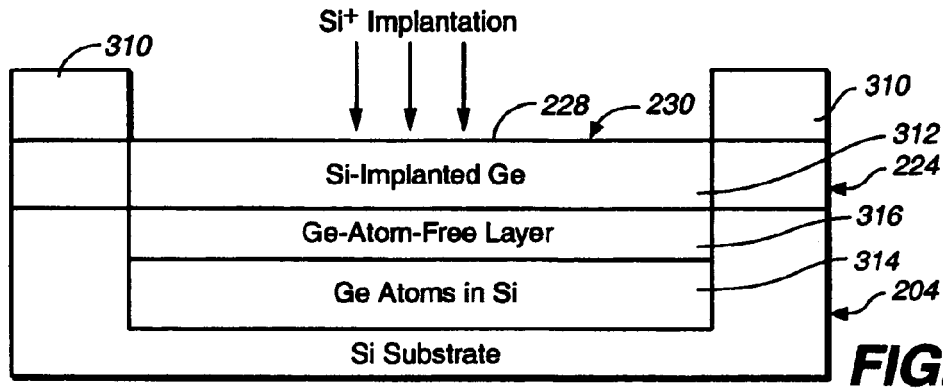
FIG._11
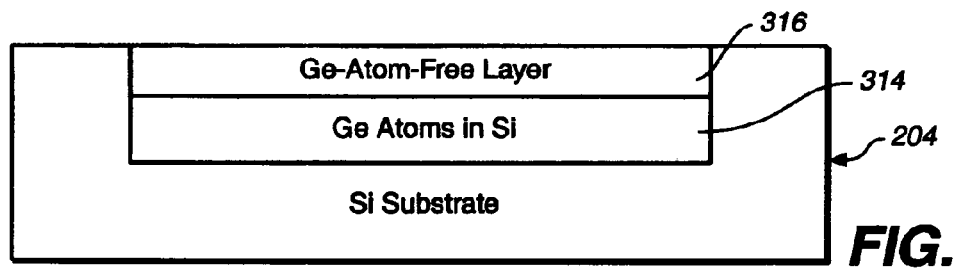
FIG._12
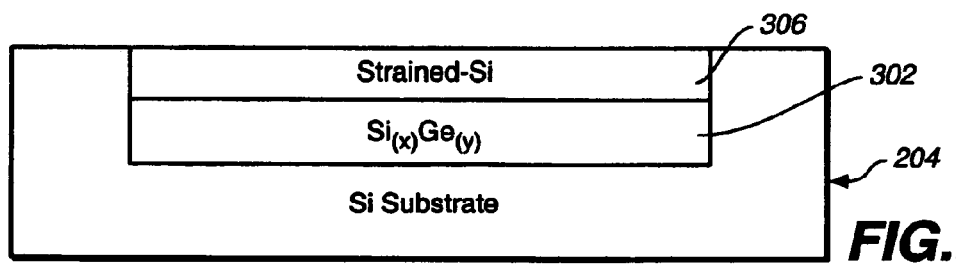
FIG._13
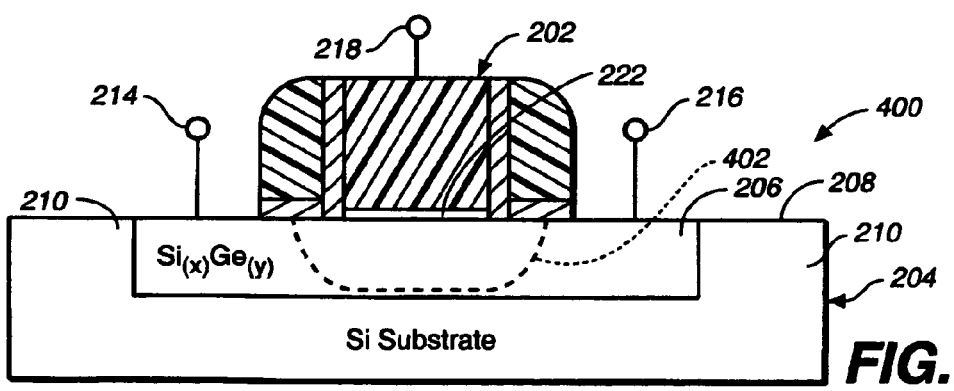
FIG._14

ION RECOIL IMPLANTATION AND ENHANCED CARRIER MOBILITY IN CMOS DEVICE

CROSS-REFERENCE TO RELATED APPLICATION

This application is a Divisional Application of U.S. patent application Ser. No. 10/418,375, filed Apr. 18, 2003 now U.S. Pat. No. 6,982,229, by Agajan Suvkhanov and Mohammad R. Mirabedini, and entitled "Ion Recoil Implantation and Enhanced Carrier Mobility in CMOS Device."

This invention is related to an invention for Ion Implantation in Channel Region of CMOS Device for Enhanced Carrier Mobility, described in U.S. patent application Ser. No. 10/418,385, which is filed concurrently herewith, invented by the present inventors, and assigned to the assignee of the present invention. The subject matter of this concurrently filed application is incorporated herein by this reference.

FIELD OF THE INVENTION

This invention relates to semiconductor integrated circuits (ICs) preferably, but not necessarily, having IC components with sub-0.1 micron dimensions and enhancements to carrier mobility in the channel region of the components. In particular, this invention relates to a new and improved technique for forming a strained-silicon layer for the channel region to enhance carrier mobility in the channel region. In this manner, relatively high performance requirements for CMOS (complimentary metal-oxide semiconductor) devices may be met without having to rely solely on scaling of the gate dielectric or of the channel length of the components.

BACKGROUND OF THE INVENTION

A significant trend throughout IC development has been to reduce the size of the components of the IC's. As the size is reduced, the performance requirements of the materials of the components become more stringent. For CMOS devices (e.g. CMOS transistors) in particular, increased performance requirements have generally been met by aggressively scaling the thickness and/or dielectrical properties of the gate dielectric and the length of the channel of the transistors. As attempts have been made to scale down CMOS technology into the sub-0.1 micron dimensions, however, the performance requirements for the CMOS devices have proven so stringent that the technique of scaling either the gate dielectric or the channel length or both has been a very difficult and/or impractical solution for meeting the high performance requirements.

To meet the increased performance requirements of the smaller CMOS devices, it has been suggested to alter characteristics other than the gate dielectric and/or channel length of the devices. One such characteristic for which improvements have been suggested is the mobility of the carriers in the channel region. For example, strained silicon (SSI) may be incorporated into the channel region, since strained silicon is known to have greater carrier mobility characteristics than do the materials that have been more commonly used in the channel region of CMOS devices. (K. Rim, S. Koester, M. Hargrove, J. Chu, P. M. Mooney, J. Ott, T. Kanarsky, P. Ronsheim, M. leong, A. Grill, and H.-S. P. Wong, "Strained Si NMOSFETs for High Performance CMOS Technology," 2001 Symposium on VLSI Technology Digest of Technical Papers, 2001, p. 59.)

Formation of a strained silicon layer on a semiconductor wafer may be done in a variety of ways. One technique involves complex fabrication processes, which includes epitaxial growth steps, such as epitaxial growth of a relatively thick silicon-germanium (SiGe) film 100 onto a silicon substrate 102 and epitaxial growth of a strained silicon layer 104 onto the SiGe film 100, as shown in FIGS. 1, 2 and 3. The strain in the silicon is induced by the underlying SiGe film. The SiGe film 100 is typically formed with a graded concentration of Ge in the Si, wherein the concentration of the Ge is slowly increased as the SiGe film 100 is grown on the substrate 102. In order to produce high quality strained silicon it is essential to carefully control the stoichiometry of the layer during the growth process. Thus, the introduction of the gases into the epitaxial growth chamber (not shown) must be carefully varied during fabrication of the SiGe film 100. In this manner, the spacing between the Si atoms in the crystalline structure of the SiGe film 100 is slowly increased from the beginning 106 to the surface 108 of the SiGe film 100. When the strained Si layer 104 is epitaxially grown on top of the SiGe film 100 (FIG. 2), the strain is effectively maintained between the Si atoms. A conventional CMOS transistor 110 (FIG. 3), having a conventional source, drain, gate and gate oxide region 112, 114, 116 and 118, is then fabricated on top of the strained Si layer 104. The increased spacing between the Si atoms in the strained Si layer 104 enhances the mobility of the carriers in the channel region, which is formed in the strained silicon layer 104 under the gate oxide 118 and between the source and drain 112 and 114.

The epitaxial growth steps increase the time and cost of fabrication required to form the IC. Thus, there is a tradeoff between the performance characteristics and the cost of the resulting IC. Additionally, the presence of the strained Si layer 104 sets limitations on the temperatures at which any subsequent processing steps may be performed, thereby limiting the flexibility with which the subsequent processing steps may be performed. Furthermore, the relatively thick SiGe film 100 acts as a thermal insulation layer, so the CMOS transistors formed thereon are susceptible to self-heating during operation of the IC, thereby degrading the performance capability of the IC. Also, isolation of the CMOS transistor 110, typically with shallow trench isolation, must be defined in both the strained Si layer 104 and the SiGe film 100 as well as in the silicon substrate 102, which adds to the complexity of the overall IC fabrication. Furthermore, this technique is prone to defects, which may occur in the SiGe film 100 and, thus, propagate into the strained Si layer 104 and higher layers of materials. Such defects may involve threaded dislocations in the crystalline structure of the various layers that negatively impact carrier mobility, gate oxide quality and overall device performance.

It is with respect to these and other considerations that the present invention has evolved.

SUMMARY OF THE INVENTION

The present invention involves formation of a silicon-germanium (SiGe) layer in a Si substrate of an IC without epitaxial growth of a SiGe film, as described in the background. Instead, a layer of Ge is deposited onto the Si substrate and Si ions are implanted into the Ge layer, which causes Ge atoms in the Ge layer to "recoil" into the underlying Si substrate to form a SiGe layer in a desired profile and at a desired depth within the Si substrate. The present invention may also involve formation of a strained Si layer above the SiGe layer and formation of a conventional CMOS device (e.g. a CMOS transistor) on either the strained Si layer or the SiGe layer. Thus, a channel region of the CMOS device includes part or all of either the strained Si layer and/or the SiGe layer.

Additionally, the present invention may involve different techniques for the formation of the strained Si layer above the SiGe layer. For example, the strained Si layer may be formed by epitaxial growth of the strained Si on the SiGe layer. Alternatively, the strained Si layer may be formed by using such high energies for the Si implantation into the overlying Ge layer that the Ge atoms recoil sufficiently deep into the underlying Si substrate that none of the Ge atoms stop near the surface of the Si substrate, so strained Si remains in a relatively thin layer near the surface of the Si substrate without the need for a strained Si epitaxial growth process.

Strained Si and Ge alloys (e.g. the SiGe layer) are known to have higher carrier mobilities than the materials more commonly used in the channel regions of CMOS devices. Therefore, the carrier mobility is enhanced for the channel region of the CMOS devices in ICs incorporating the present invention. The carrier mobility enhancement is particularly beneficial in ICs having CMOS devices formed with sub-0.1 micron technology, because it is not necessary to aggressively scale the length of the channel regions or the gate dielectric of the CMOS devices. The carrier mobilities under the present invention may not be enhanced as much as those under the strained Si technique described in the background. However, the present invention involves simpler, less expensive and less time-consuming fabrication procedures, making the present invention an improvement over the prior technique.

These and other aspects and improvements of the present invention are accomplished in an IC and a method of forming an IC having a CMOS device formed above a semiconductor substrate having Ge therein. The Ge is placed into the semiconductor substrate by a recoil procedure.

The CMOS device is preferably, but not necessarily, formed using sub-0.1 micron technology. Additionally, according to various embodiments of the present invention, the CMOS device is preferably formed 1) on the Ge-containing region of the semiconductor substrate, 2) on a strained Si region within the semiconductor substrate formed above the Ge-containing region of the semiconductor substrate or 3) on a strained Si layer that is formed above the semiconductor substrate on the Ge-containing region of the semiconductor substrate. Thus, the channel region of the CMOS device preferably includes the strained Si region and/or the Ge-containing region. In each of these cases, therefore, the carrier mobility in the channel region of the CMOS device is preferably greater than that in the semiconductor substrate outside of either the Ge-containing region or the strained Si region. The enhanced carrier mobility is particularly significant for enabling the present invention to meet the performance requirements of sub-0.1 micron technology using the relatively simple Ge-recoil procedure, instead of the complex and costly techniques described in the background.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

BRIEF DESCRIPTION OF THE DRAWINGS

FIGS. 1–3 are simplified, broken, cross-sectional views of portions of a prior art integrated circuit, which show prior art steps involved in the fabrication of the prior art integrated circuit.

FIG. 4 is a simplified, broken, cross-sectional view of a portion of an integrated circuit in which the present invention is incorporated and which has been fabricated according to the present invention.

FIGS. 5–9 are simplified, broken, cross-sectional views of portions of the integrated circuit shown in FIG. 4 showing intermediate steps involved in the fabrication of the integrated circuit.

FIG. 10 is a simplified, broken, cross-sectional view of a portion of an alternative integrated circuit in which an alternative embodiment of the present invention is incorporated and which has been fabricated according to the present invention.

FIGS. 11–13 are simplified, broken, cross-sectional views of portions of the integrated circuit shown in FIG. 10 showing intermediate steps involved in the fabrication of the integrated circuit.

FIG. 14 is a simplified, broken, cross-sectional view of a portion of another alternative integrated circuit in which another alternative embodiment of the present invention is incorporated and which has been fabricated according to the present invention.

DETAILED DESCRIPTION

A portion of an integrated circuit (IC) 200 which incorporates the present invention and which is formed by the methodology of the present invention is shown in FIG. 4. The IC 200 includes a CMOS device 202 (such as a conventional CMOS transistor) formed above a silicon (Si) substrate 204 preferably, but not necessarily, with sub-0.1 micron technology. The Si substrate 204 generally includes an ion-implanted region 206 that extends below the surface 208 of the Si substrate 204. The ion-implanted region 206 is formed by an ion recoil procedure described below. The Si substrate 204 may also include conventional non-implanted regions 210, such as are used with conventional CMOS devices (not shown) and the channel regions thereof. A strained Si region 212 is formed on the ion-implanted region 206 and the CMOS device 202 is formed thereon. The strained Si region 212 is preferably formed by strained Si epitaxial growth or by other strained Si formation techniques. The CMOS device 202 generally includes a source 214 and a drain 216 which are formed on the strained Si region 212. A gate 218 separates the source 214 and the drain 216. When the CMOS device 202 is activated during operation of the IC 200, the source 214 and the drain 216 are electrically connected by a channel 220, which extends primarily in the strained Si region 212 between the source 214 and the drain 216, as shown. However, the channel 220 may alternatively include portions of the ion-implanted region 206. The gate 218 is separated by and insulated from the channel 220 by a gate dielectric region or layer 222.

The channel 220 has enhanced carrier mobility characteristics that enable the present invention to be incorporated in IC's having structures with very small dimensions, such as the sub-0.1 micron technology devices. The enhanced carrier mobility characteristics of the channel 220 also enable the present invention to be incorporated in any CMOS technology, regardless of whether the sub-0.1 micron technology has been used in the IC's.

The strained Si region 212 has greater carrier mobility characteristics than do the non-implanted regions 210 of the Si substrate 204. The non-implanted regions 210 have been commonly used in the prior art as a base on which conventional CMOS devices have been formed, so that the channel regions of the conventional CMOS devices were formed in the non-implanted regions 210. Thus, the carrier mobility in the channel 220 of the CMOS device 202 is higher than the carrier mobility in the channel regions of prior art CMOS devices (not shown).

The ion-implanted region 206 may be either N channel or P channel silicon in the Si substrate 204 that is implanted with ions (such as germanium ($Ge^+$) ions) to form the ion-implanted region 206 (such as a SiGe layer) according to a procedure described with reference to FIGS. 5–8. As shown in FIG. 5, a layer 224 of a material having a preferred ion, such as Ge, to be implanted into the Si substrate 204 is deposited (e.g. by physical vapor deposition, PVD) onto the Si substrate 204.

A pattern is formed on the implant material layer 224, such as with a conventional mask 226, as shown in FIG. 6, to expose only a desired portion 228 of the surface 230 of the implant material layer 224. (Alternatively, the entire surface 230 of the implant material layer 224 may be exposed.) Si is then implanted into a region (e.g. Si-implanted region 232) of the implant material layer 224 below the desired portion 228 of the surface 230. The implantation of the Si is performed in such a manner that atoms (e.g. Ge atoms) in the Si-implanted region 232 of the implant material layer 224 recoil into the Si substrate 204 to form a region 234 of the Si substrate 204 that contains the atoms.

The mask 226 is removed, as shown in FIG. 7. Then the implant material layer 224, including the Si-implanted region 232 thereof, is removed (e.g. via conventional wet etch). An anneal cycle is then performed to re-crystallize the atom-containing region 234 in the Si substrate 204. For Ge as the preferred ion, for example, the anneal cycle results in converting the atom-containing region 234 into a $Si_{(x)}Ge_{(y)}$ layer 236, as shown in FIG. 8. The $Si_{(x)}Ge_{(y)}$ layer 236 thus corresponds to the ion-implanted region 206 (FIG. 4).

The dose of the ions and the energy level for a Si implantation procedure (see FIG. 6) to form the ion-implanted region 206 generally depend on the desired performance of the CMOS device 202 (FIG. 4). An exemplary Si ion dose range for the Si implantation process is approximately 1e15 to 1e16 with an exemplary implantation energy range of approximately 10 to 120 keV. At such ranges, the Si implantation process will result in a desired concentration profile of the preferred ion (e.g. $Ge^+$ ions) in the $Si_{(x)}Ge_{(y)}$ layer 236 (FIG. 8) after the anneal cycle. The concentration profile generally increases from a low concentration at the bottom 238 of the $Si_{(x)}Ge_{(y)}$ layer 236 to a high concentration at the top 240 of the $Si_{(x)}Ge_{(y)}$ layer 236. Thus, the spacing between the Si atoms in the $Si_{(x)}Ge_{(y)}$ layer 236 slowly increases from the bottom 238 to the top 240.

Due to the spacing between the Si atoms at the top 240 of the $Si_{(x)}Ge_{(y)}$ layer 236, the strained Si region 212 (FIG. 4) may be formed on top of the $Si_{(x)}Ge_{(y)}$ layer 236, as shown in FIG. 9. The strained Si region 212 is preferably formed by a Si epitaxial growth process. The CMOS device 202 (FIG. 4) may then be formed on top of the strained Si region 212, so that the channel 220 (FIG. 4) of the CMOS device 202 may include the enhanced carrier mobility characteristics of the strained Si region 212 and possibly of the $Si_{(x)}Ge_{(y)}$ layer 236.

A portion of an alternative IC 300 which incorporates the present invention and which is formed by the methodology of the present invention is shown in FIG. 10. The IC 300 has some similarities to the IC 200 (FIG. 4) and includes the CMOS device 202 formed above the Si substrate 204 preferably, but not necessarily, with sub-0.1 micron technology. The Si substrate 204 generally includes an ion-implanted region 302 that extends below the surface 304 of the Si substrate 204. The ion-implanted region 302 is formed by an ion recoil procedure. The Si substrate 204 may also include the conventional non-implanted regions 210 described above. Unlike for the IC 200, wherein the strained Si region 212 (FIG. 4) is formed "on" the Si substrate 204, a strained Si region 306 (e.g. approximately <70–100 Angstroms) is formed above the ion-implanted region 302 "within" the Si substrate 204. Additionally, the strained Si region 306 is preferably formed in combination with the ion recoil procedure that forms the ion-implanted region 302. The CMOS device 202 is then conventionally formed on the strained Si region 306.

The CMOS device 202 generally includes the source 214 and the drain 216 which are formed on the strained Si region 306. The gate 218 separates the source 214 and the drain 216. When the CMOS device 202 is activated during operation of the IC 300, the source 214 and the drain 216 are electrically connected by a channel 308, which extends primarily in the strained Si region 306 between the source 214 and the drain 216, as shown. However, the channel 308 may alternatively include portions of the ion-implanted region 302. The gate 218 is separated by and insulated from the channel 308 by the gate dielectric region or layer 222.

Since the strained Si region 306 has greater carrier mobility characteristics than do the non-implanted regions 210 of the Si substrate 204, the channel 308 has enhanced carrier mobility characteristics that enable this embodiment of the present invention to be incorporated in IC's having structures with very small dimensions, such as the sub-0.1 micron technology devices. The enhanced carrier mobility characteristics of the channel 308 also enable the present invention to be incorporated in any CMOS technology, regardless of whether the sub-0.1 micron technology has been used in the IC's.

The ion-implanted region 302 may be either N channel or P channel silicon in the Si substrate 204 that is implanted with ions (such as $Ge^+$ ions) according to a procedure described with reference to FIGS. 5, 11, 12 and 13. As mentioned above, the implant material layer 224 having the preferred ion, such as Ge, to be implanted into the Si substrate 204 is deposited onto the Si substrate 204, as shown in FIG. 5.

A pattern is formed on the implant material layer 224, such as with a conventional mask 310, as shown in FIG. 11, to expose only the desired portion 228 of the surface 230 of the implant material layer 224. Si is then implanted into a region (e.g. Si-implanted region 312) of the implant material layer 224 below the desired portion 228 of the surface 230. The implantation of the Si is performed in such a manner that atoms (e.g. Ge atoms) in the Si-implanted region 312 of the implant material layer 224 recoil into the Si substrate 204 to form a region 314 of the Si substrate 204 that contains the atoms. The implantation energy used in the Si implantation procedure is sufficiently high to cause the atoms from the Si-implanted region 312 of the implant material layer 224 to recoil through an initial layer 316 in the vicinity of the surface 230 of the Si substrate 204, leaving the initial layer 316 substantially free of the recoiled atoms.

The mask 310 is removed, as shown in FIG. 12. Then the implant material layer 224, including the Si-implanted region 312 thereof, is removed (e.g. via conventional wet etch). An anneal cycle is then performed to re-crystallize the atom-containing region 314 and the initial layer 316 of the Si substrate 204. For Ge as the preferred ion, for example, the anneal cycle results in converting the atom-containing region 314 into a $Si_{(x)}Ge_{(y)}$ layer, i.e. the ion-implanted region 302, as shown in FIG. 13 (see also FIG. 10). Additionally, the anneal cycle also results in converting the initial layer 316 into the strained-Si region 306 (see also FIG. 10) by virtue of the strain between the Si atoms in the underlying ion-implanted region 302.

According to this procedure, the strained-Si region 306 is formed within the Si substrate 204 and without a more expensive and time-consuming Si epitaxial growth process. Additionally, the strained-Si region 306 can be made relatively thin (e.g. 100–300 Angstroms) with this procedure.

The CMOS device 202 (FIG. 10) is then formed on the strained-Si region 306 of the Si substrate 204. In this manner, the CMOS device 202 may be formed with a relatively thin strained-Si layer having enhanced carrier mobility for the channel 308.

A portion of another alternative IC 400 which incorporates the present invention and which is formed by the methodology of the present invention is shown in FIG. 14. The IC 400 includes the CMOS device 202 formed above the Si substrate 204 preferably, but not necessarily, with sub-0.1 micron technology. The Si substrate 204 generally includes the ion-implanted region 206 that extends below the surface 208 of the Si substrate 204. The ion-implanted region 206 is formed by the ion recoil procedure described herein. The Si substrate 204 may also include the conventional non-implanted regions 210. The CMOS device 202 is conventionally formed on the ion-implanted region 206, rather than on a strained-Si layer as described in the above embodiments. The CMOS device 202 generally includes the source 214 and the drain 216 which are formed on the ion-implanted region 206. The gate 218 separates the source 214 and the drain 216. When the CMOS device 202 is activated during operation of the IC 400, the source 214 and the drain 216 are electrically connected by a channel 402, which extends primarily in the ion-implanted region 206 between the source 214 and the drain 216, as shown. The gate 218 is separated by and insulated from the channel 402 by the gate dielectric region or layer 222.

The carrier mobility for the ion-implanted region 206 is generally higher than the carrier mobility for the non-implanted regions 210. Therefore, since the channel 402 is formed in the ion-implanted region 206, the overall carrier mobility of the CMOS device 202 is enhanced. The enhanced carrier mobility characteristics enable this embodiment of the present invention to be incorporated in IC's having structures with very small dimensions, such as the sub-0.1 micron technology devices. The enhanced carrier mobility characteristics of the channel 402 also enable the present invention to be incorporated in any CMOS technology, regardless of whether the sub-0.1 micron technology has been used in the IC's.

The ion-implanted region 206 is implanted with ions (such as $Ge^+$ ions) according to the procedure described above with reference to FIGS. 5–8. Without formation of a strained-Si layer, the CMOS device 202 is formed on the ion-implanted region 206. The implanted ions increase the carrier mobility characteristics in the Si substrate 204.

It is apparent from the previous description that each embodiment of the present invention permits the fabrication of CMOS devices, particularly sub-0.1 micron technology devices, without the complex and costly procedures suggested in the prior art. Though the enhancement in the carrier mobility may not be as great as in the prior art, the enhancement is sufficient to enable low-cost alternatives to the prior art. The present invention can also be tailored for selective introduction of the ions into both N channel and P channel device regions with different ion doses as necessary to achieve an optimized CMOS device performance in a variety of applications. Additionally, the present invention may be used for devices built on SOI (silicon-on-insulator) or other thin film technologies. Many other advantages and improvements will be apparent after gaining a complete appreciation of the present invention.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

The invention claimed is:

1. An integrated circuit comprising:
   a semiconductor substrate;
   a silicon-germanium region in the semiconductor substrate;
   a CMOS device formed above the silicon-germanium region in the semiconductor substrate; and
   a strained silicon layer above the silicon-germanium region and on which the CMOS device is formed;
   and wherein:
   the silicon-germanium region in the semiconductor substrate is formed by recoil of germanium into the semiconductor substrate; and
   the strained silicon layer is formed by recoiling the germanium into the semiconductor substrate to a depth that a region of the semiconductor substrate near the surface of the semiconductor substrate is substantially free of germanium, the substantially germanium-free region of the semiconductor substrate forming the strained silicon layer.

2. An integrated circuit as defined in claim 1 wherein:
   the silicon-germanium region in the semiconductor substrate is further formed by depositing a germanium layer on the semiconductor substrate and implanting silicon into the germanium layer, and the implanting silicon causes a portion of the germanium in the germanium layer to recoil into the semiconductor substrate to form the silicon-germanium region.

3. An integrated circuit as defined in claim 1 wherein:
   the semiconductor substrate has a first carrier mobility;
   the strained silicon layer has a second carrier mobility greater than the first carrier mobility; and
   the CMOS device has a channel region formed in the strained silicon layer.

4. An integrated circuit as defined in claim 1 wherein the CMOS device is formed using sub-0.1 micron technology.

* * * * *